(12) United States Patent
Kung et al.

(10) Patent No.: US 6,576,403 B2
(45) Date of Patent: Jun. 10, 2003

(54) METHOD FOR FORMING A THIN FILM TRANSISTOR WITH A LIGHTLY DOPED DRAIN STRUCTURE

(75) Inventors: Ji-ho Kung, Miao Li (TW); Chih-chang Chen, Yun Lin (TW)

(73) Assignee: Hannstar Display Corporation (TW)

( * ) Notice: Subject to any disclaimer, the term of this patent is extended or adjusted under 35 U.S.C. 154(b) by 0 days.

(21) Appl. No.: 09/752,900

(22) Filed: Dec. 27, 2000

(65) Prior Publication Data

US 2002/0012883 A1 Jan. 31, 2002

(30) Foreign Application Priority Data

Jul. 25, 2000 (TW) ........................................ 89114875 A

(51) Int. Cl.[7] ...................... H01L 21/00; H01L 21/336; H01L 21/8238
(52) U.S. Cl. ...................... 430/315; 430/311; 430/319; 438/142; 438/149; 438/549
(58) Field of Search ................................. 430/311, 319; 438/142, 149, 549

(56) References Cited

U.S. PATENT DOCUMENTS 5,543,342 A * 8/1996 Mukai et al. ................ 430/311
5,981,320 A * 11/1999 Lee ............................ 438/199

OTHER PUBLICATIONS

Tapered Photoresist for a Doping Profile; IBM–TDB; #NN83112682, Nov. 1, 1983.*

* cited by examiner

Primary Examiner—Mark F. Huff
Assistant Examiner—Kripa Sagar
(74) Attorney, Agent, or Firm—Martine & Penilla, LLP

(57) ABSTRACT

A method for forming a thin film transistor with lightly doped drain structure comprising the steps of forming a gate insulating layer and a gate electrode on a polysilicon layer; forming a photoresist layer with a predetermined thickness on the gate electrode and on a portion of the polysilicon layer; and implanting first conductive type impurities into the polysilicon layer so as to form a first ion-implant region and a second ion-implant region, wherein the doping concentration of the second ion-implant region is higher than that of the first ion-implant region.

7 Claims, 6 Drawing Sheets

METHOD FOR FORMING A THIN FILM TRANSISTOR WITH A LIGHTLY DOPED DRAIN STRUCTURE

BACKGROUND OF THE INVENTION

1. Field of the Invention

The invention relates to a method for forming a thin film transistor (TFT) and, more particularly, to a method for forming a thin film transistor with a lightly doped drain (LDD) structure.

2. Description of the Related Art

At present, methods for forming liquid crystal display (LCD) devices and panels are mainly based on polysilicon thin film transistor technologies.

FIGS. 1A through 1F sequentially show steps for forming a thin film transistor for an LCD device. As shown in FIG. 1A, a polysilicon layer 102 is formed on a glass substrate 100. A gate insulating layer 104 and a gate electrode 106 are sequentially formed on the polysilicon layer. As an example, the gate insulating layer 104 and the gate electrode 106 can be formed by sequentially depositing nitride and polysilicon on the polysilicon layer 102, and then patterning the deposited nitride and polysilicon layer.

Next, as shown in FIG. 1B, N-type impurities 108 are implanted to the polysilicon layer 102, to form a first ion-implant region 110, as shown in FIG. 1C. After that, an oxide layer (not shown) is deposited on the gate insulating layer 104 and the gate electrode 106, and the oxide layer is then patterned to form sidewall spacers 112 on both sides of the gate electrode 106, as shown in FIG. 1D.

Subsequently, as shown in FIG. 1E, using the sidewall spacers 112 as masks, N-type impurities 114 are implanted in the polysilicon layer 102, to form a second ion-implant region 116, as shown in FIG. 1F. The doping concentration of the second ion-implant region 116 is higher than that of the first ion-implant region 110. The first ion-implant region 110 with lower doping concentration is called a lightly doped drain region.

SUMMARY OF THE INVENTION

One object of the invention is to provide a method for forming a thin film transistor with a lightly doped drain structure; the manufacturing steps are simplified than in prior art methods. Therefore, the yield of the thin film transistor can be increased and the production costs can also be lowered.

In accordance with one example of the invention, the method for forming a thin film transistor comprises the steps of: forming a gate insulating layer and a gate electrode on a polysilicon layer; forming a photoresist layer with a predetermined thickness on the gate electrode and on a portion of the polysilicon layer; and implanting first conductive type impurities into the polysilicon layer so as to form a first ion-implant region and a second ion-implant region, wherein the doping concentration of the second ion-implant region is higher than that of the first ion-implant region.

In accordance with another example of the invention, the method for forming a thin film transistor comprises the steps of: forming a first polysilicon layer and a second polysilicon layer on a glass substrate, respectively corresponding to a predetermined region for first conductive type thin film transistor and a predetermined region for second conductive type thin film transistor; forming a first gate insulating layer and a first gate electrode on the first polysilicon layer; forming a second gate insulating layer and a second gate electrode on the second polysilicon layer; forming a first photoresist layer with a first predetermined thickness and a second photoresist layer with a second predetermined thickness with the use of a gray level mask, wherein the first photoresist layer is formed on the first gate electrode and on the first polysilicon layer, the second photoresist layer is formed on the second gate electrode and on a portion of the second polysilicon layer, and the first predetermined thickness is larger than the second predetermined thickness; and implanting first conductive type impurities the second polysilicon layer so as to form a first ion-implant region and a second ion-implant region in the second polysilicon layer, wherein the doping concentration of the second ion-implant region is higher than that of the first ion-implant region.

DESCRIPTION OF THE PREFERRED EMBODIMENT

One embodiment of the invention will be described with reference to FIGS. 2A through 2D.

Figure 1A:
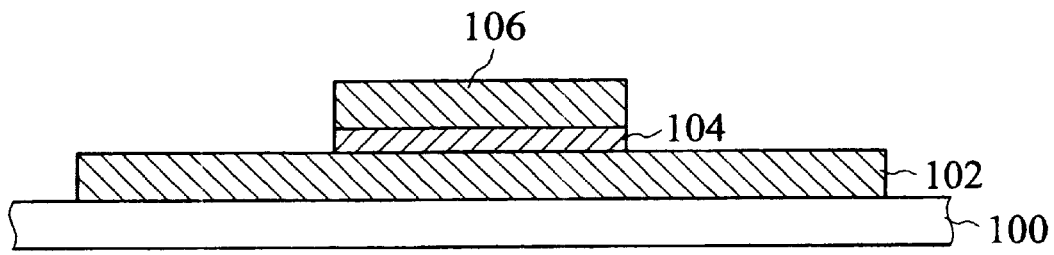
FIGS. 1A through 1F are sectional views sequentially showing steps for forming a thin film transistor in accordance with a conventional method.
Figure 1B:
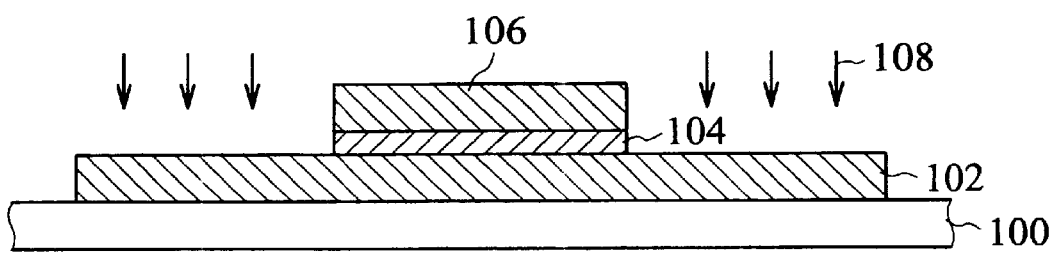
Figure 1C:
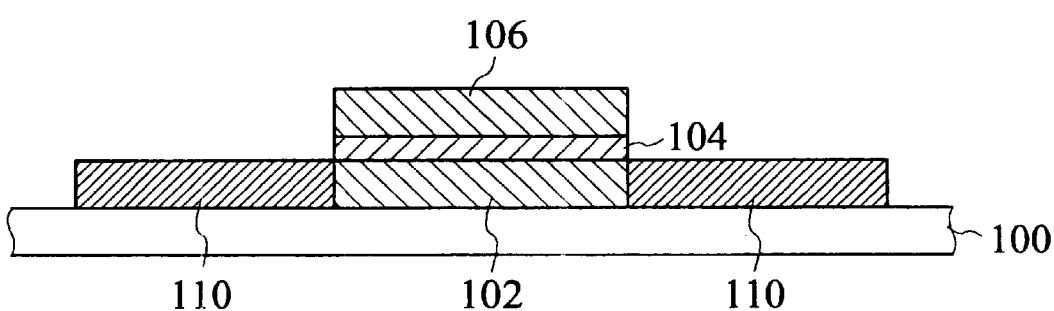
Figure 1D:
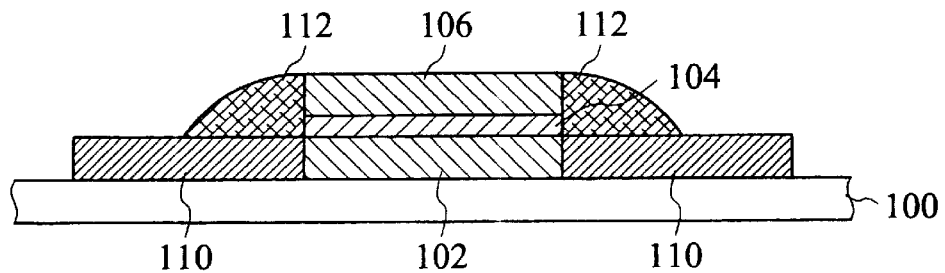
Figure 1E:
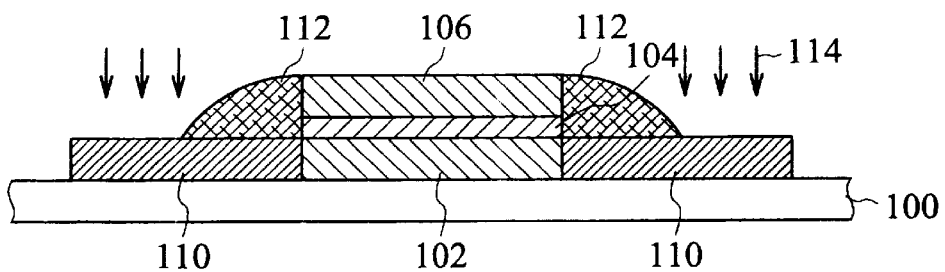
Figure 1F:
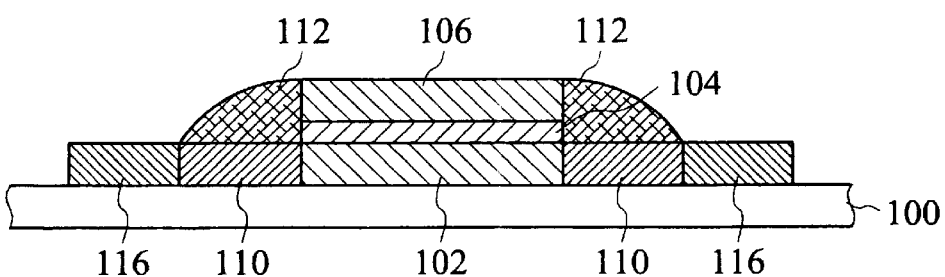
Figure 2A:
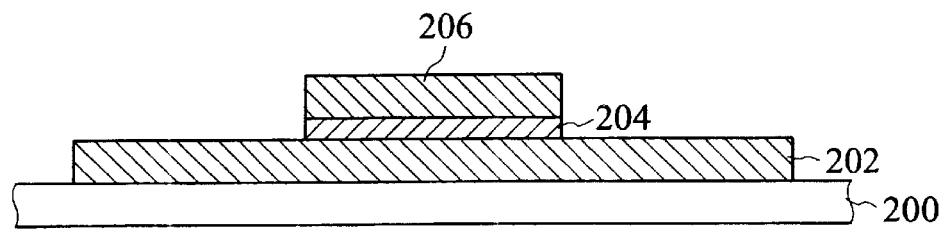
FIGS. 2A through 2D are sectional views sequentially showing steps for forming a thin film transistor in accordance with the invention.

FIGS. 2A through 2D sequentially show steps of the method in accordance with the invention for forming a thin film transistor with a lightly doped drain structure. As shown in FIG. 2A, a polysilicon layer 202 is formed on a glass substrate 200. A gate insulating layer 204 and a gate electrode 206 are sequentially formed on the polysilicon layer 202. The gate insulating layer 204 and the gate electrode 206 can be formed by sequentially depositing nitride and polysilicon on the polysilicon layer 202, and then patterning the deposited nitride and polysilicon layer.

Figure 2B:
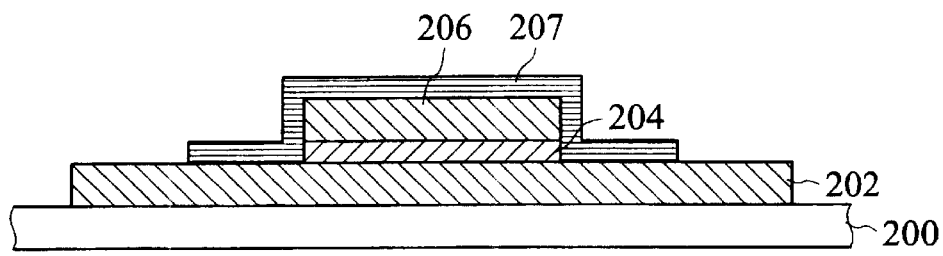

Next, as shown in FIG. 2B, a photoresist layer 207 with a predetermined thickness is formed on the gate electrode 206 and on a portion of the polysilicon layer 202. The photoresist layer 207 has a portion formed on the polysilicon layer 202. The portion of the photoresist layer 207 covers a portion of the polysilicon layer 202 that is to be formed into a lightly doped drain. It is preferred that the photoresist layer 207 with the predetermined thickness has a thickness ranging from 4000 Å to 1.5 $\mu$m.

Figure 2C:
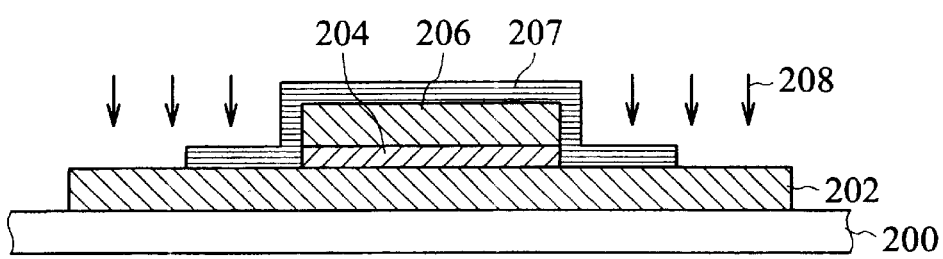
Figure 2D:
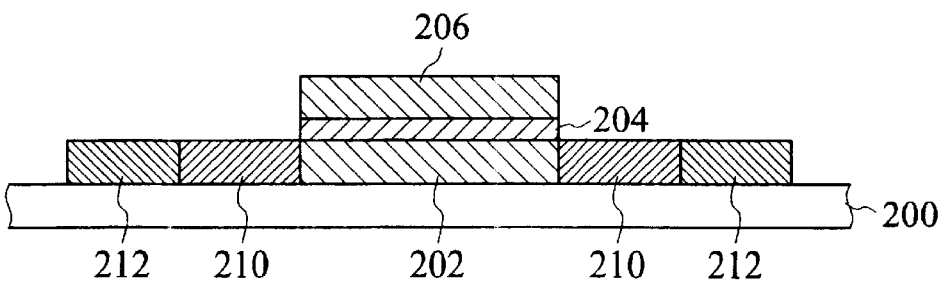

Subsequently, as shown in FIG. 2C, first conductive type (such as N-type) impurities 208 are implanted into the polysilicon layer 202 so as to form a first ion-implant region 210 and a second ion-implant region 212, as shown in FIG. 2D. The doping concentration of the second ion-implant region 212 is higher than that of the first ion-implant region 210. The first ion-implant region 210 with lower doping concentration is a lightly doped drain region.

Next, another embodiment of the invention will be described with reference to FIGS. 3A through 3C.

Figure 3A:
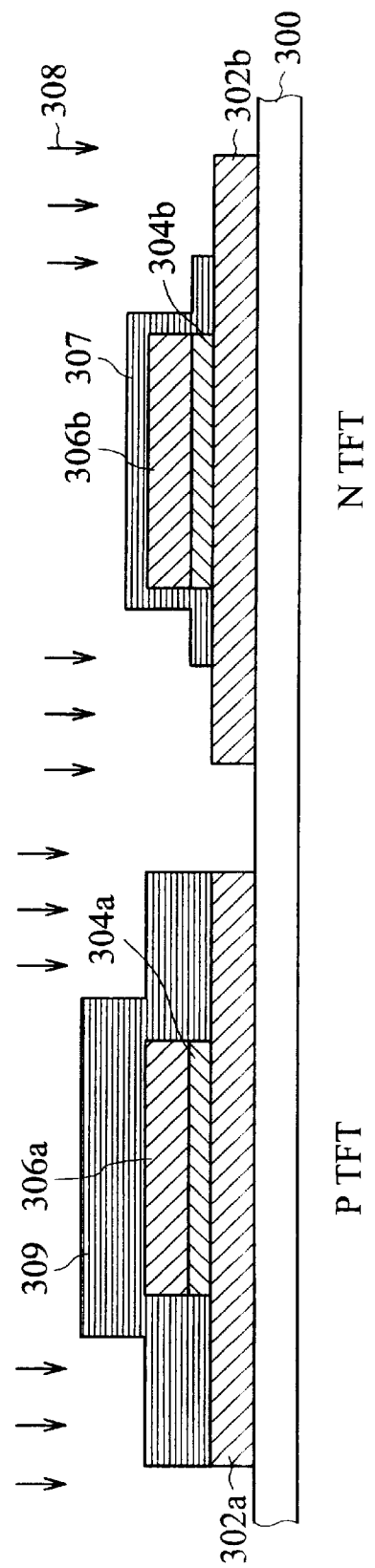
FIGS. 3A through 3C are sectional views showing formation of an N-type thin film transistor (NTFT) and a P-type thin film transistor (PTFT) at the same time by using the method of the invention.
Figure 3B:
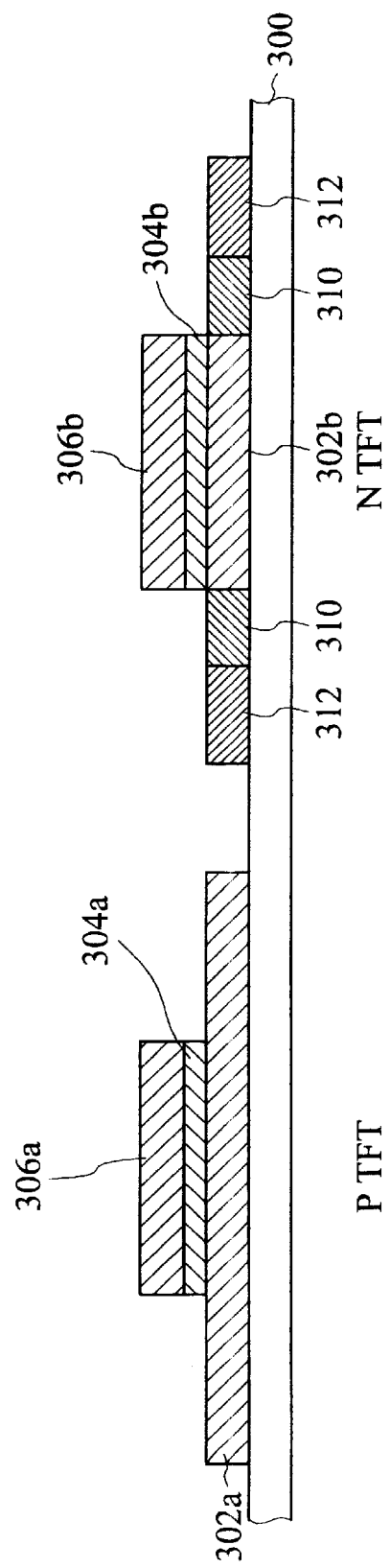
Figure 3C:
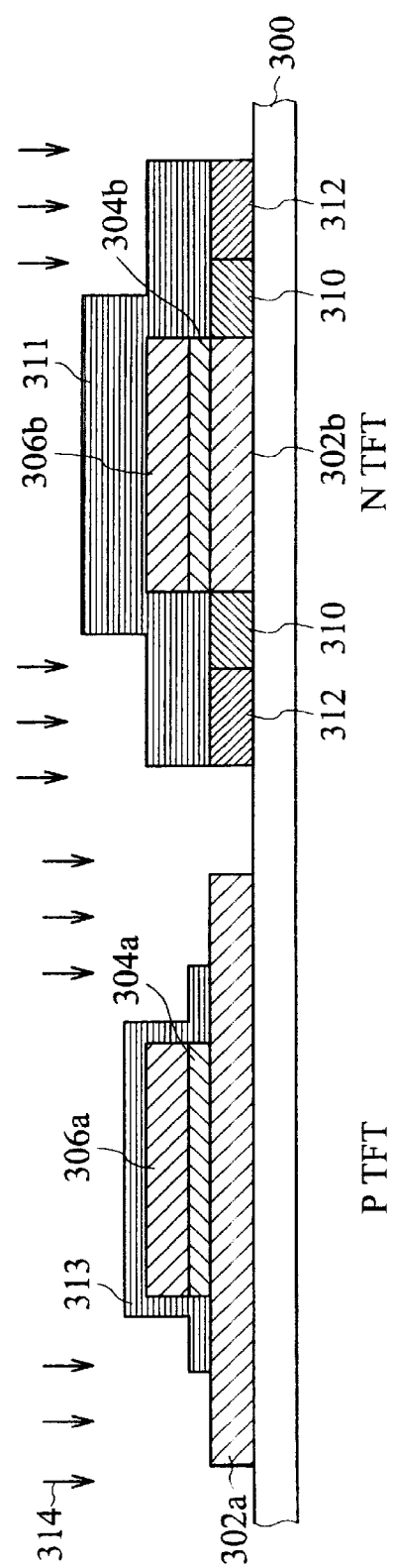

FIGS. 3A through 3C show steps of the method of the invention for simultaneously forming an N-type (first conductive type) thin film transistor (NTFT) and a P-type (second conductive type) thin film transistor (PTFT) with a lightly doped drain structure. As shown in FIG. 3A, polysilicon layers 302a and 302b are formed on a glass substrate. A gate 300 insulating layer 304a and a gate electrode 306a are sequentially formed on the polysilicon layer 302a; and a gate insulating layer 304b and a gate electrode 306b are sequentially formed on the polysilicon layer 302b. The gate electrode 306a corresponds to a predetermined region for NTFT, and the gate electrode 306b corresponds to a predetermined region for PTFT. Next, a thin and predetermined photoresist layer 307 and a thick and predetermined photoresist layer 309 are formed with the use of a gray level mask (not shown). The thin and predetermined photoresist layer 307 is over the gate electrode 306a and the thick and predetermined photoresist layer 309 is over the gate electrode 306b. The gray level mask has a pattern thereon with color of different darkness so that photoresist corresponding to the color of different darkness is subjected to different intensity of illumination. Thereby, the photoresist layers 307 and 309 with different thicknesses can be formed. It is preferred that the thin and predetermined photoresist layer 307 has a thickness ranging from 4000 Å to 1.5 $\mu$m, and the thick and predetermined photoresist layer 309 has a thickness ranging from 2 to 4 $\mu$m. As with the photoresist layer 207 of the above-mentioned embodiment, the thin and predetermined photoresist layer 307 covers on the gate electrode 306b and on a portion of the polysilicon layer 302b. The thick and predetermined photoresist layer 309 covers on the gate electrode 306a and on the entire surface of the polysilicon layer 302a.

Next, N-type (first conductive type) impurities 308 are implanted into the polysilicon layer 302b so that a first ion-implant region 310 and a second ion-implant region 312 is formed in the polysilicon layer 302b of the predetermined region for NTFT, as shown in FIG. 3B. The p doping concentration of the second ion-implant region 312 is higher than that of the first ion-implant region 310. On the other hand, since the thick and predetermined photoresist layer 309 can block the N-type impurities 308 during the implantation, the polysilicon layer 302a of the predetermined region for PTFT is not implanted with N-type impurities 308.

Subsequently, as shown in FIG. 3C, P-type impurities 314 are implanted into the polysilicon layer 302a so as to form the PTFT by employing the same principle as in the formation of the NTFT. When forming the PTFT, a thin and predetermined photoresist layer 313 is formed on the gate electrode 306a and on a portion of the polysilicon layer 302a; and a thick and predetermined photoresist layer 311 is formed on the gate electrode 306b and on the entire surface of the polysilicon layer 302b.

While the present invention has been particularly described, in conjunction with specific examples, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for forming a thin film transistor comprising:
   forming a gate insulating layer and a gate electrode on a polysilicon layer;
   forming a photoresist layer with a predetermined thickness on said gate electrode and on a portion of said polysilicon layer; and
   implanting first conductive type impurities into said polysilicon layer with said photoresist layer as a mask so that a first ion-implant region and a second ion-implant region are formed at the same time in one step,
   wherein said first ion-implant region is a region in said polysilicon layer that is positioned under said photoresist layer, and the doping concentration of said second ion-implant region is higher than that of said first ion-implant region, and wherein the first and second ion-implant regions are formed after the gate insulating layer and the gate electrode are formed.

2. The method as in claim 1, wherein said gate insulating layer and said gate electrode are formed by sequentially depositing nitride and polysilicon on said polysilicon layer, and then patterning the deposited nitride and polysilicon layer.

3. The method as in claim 1, wherein said photoresist layer with said predetermined thickness has a thickness ranging from 4000 Å to 1.5 $\mu$m.

4. A method for forming a thin film transistor comprising:
   forming a first polysilicon layer and a second polysilicon layer on a glass substrate respectively corresponding to a predetermined region for first conductive type thin film transistor and a predetermined region for second conductive type thin film transistor;
   forming a first gate insulating layer and a first gate electrode on said first polysilicon layer;
   forming a second gate insulating layer and a second gate electrode on said second polysilicon layer;
   forming a first photoresist layer with a first predetermined thickness and a second photoresist layer with a second predetermined thickness with the use of the gray level mask, wherein said first photoresist layer is formed on said first gate electrode and on said first polysilicon layer, said second photoresist layer is formed on said second gate electrode and on a portion of said second polysilicon layer, and said first predetermined thickness is larger than said second predetermined thickness; and
   implanting first conductive type impurities into said second polysilicon layer so that a ion-implant region and a second ion-implant region are formed in said second polysilicon layer at the same time in one step,
   wherein the doping concentration of said second ion-implant region is higher than that of said first ion-implant region, and wherein the first and second ion-implant regions are formed after the first and second gate insulating layers and the first and second gate electrodes are formed.

5. The method as in claim 4, wherein said gate insulating layer and said gate electrode are formed by sequentially depositing nitride and polysilicon on said polysilicon layer, and then patterning the deposited nitride and polysilicon layer.

6. The method as in claim 4, wherein said first predetermined thickness ranges from 2 to 4 $\mu$m.

7. The method as in claim 4, wherein said second predetermined thickness ranges from 4000 Å to 1.5 $\mu$m.

* * * * *